United States Patent
Chung

(10) Patent No.: US 10,250,187 B2
(45) Date of Patent: Apr. 2, 2019

(54) SOLAR CELL MONITORING DEVICE

(71) Applicant: WOONZIE POWER TECHNIC CO., LTD., Seoul (KR)

(72) Inventor: Hyun A Chung, Gwangmyeong-si (KR)

(73) Assignee: WOONZIE POWER TECHNIC CO., LTD., Seoul (KR)

(*) Notice: Subject to any disclaimer, the term of this patent is extended or adjusted under 35 U.S.C. 154(b) by 0 days.

(21) Appl. No.: 15/739,160

(22) PCT Filed: Jun. 29, 2016

(86) PCT No.: PCT/KR2016/006920
§ 371 (c)(1),
(2) Date: Dec. 22, 2017

(87) PCT Pub. No.: WO2017/003162
PCT Pub. Date: Jan. 5, 2017

(65) Prior Publication Data
US 2018/0375469 A1  Dec. 27, 2018

(30) Foreign Application Priority Data

Jun. 30, 2015 (KR) .................. 10-2015-0092625

(51) Int. Cl.
*H02S 50/10* (2014.01)
*G01R 13/02* (2006.01)
(Continued)

(52) U.S. Cl.
CPC .............. *H02S 50/10* (2014.12); *G01R 13/02* (2013.01); *G01R 19/0092* (2013.01); *G01R 19/165* (2013.01); *H02S 40/32* (2014.12)

(58) Field of Classification Search
CPC ..... H02S 50/10; H02S 40/32; G01R 19/0092; G01R 13/02; G01R 19/165
(Continued)

(56) References Cited

U.S. PATENT DOCUMENTS 9,910,053 B2 * 3/2018 Bakhru .............. G01N 33/4905
2012/0084027 A1   4/2012 Caine
(Continued)

FOREIGN PATENT DOCUMENTS

JP        10-326902 A     12/1998
JP        2015-076933 A    4/2015
(Continued)

OTHER PUBLICATIONS

International Search Report for PCT/KR2016/006920 dated Oct. 7, 2016 from Korean Intellectual Property Office.

*Primary Examiner* — Giovanni Astacio-Oquendo
(74) *Attorney, Agent, or Firm* — Revolution IP, PLLC

(57) ABSTRACT

A solar cell monitoring device includes: an inverter; connection boards which include multiple string circuits, respectively; a terminal block which is provided at an input side of the inverter, and includes multiple branch terminals which are connected to wires that are connected to the connection boards, respectively and supply direct current power to the inverter; detection elements which are provided at a side of the branch terminals; and a measurement unit which measures the currents of the wires which are detected by the detection elements.

9 Claims, 8 Drawing Sheets

(51) Int. Cl.
*G01R 19/165* (2006.01)
*H02S 40/32* (2014.01)
*G01R 19/00* (2006.01)

(58) Field of Classification Search
USPC .................................. 324/500, 537, 761.01
See application file for complete search history.

(56) References Cited

U.S. PATENT DOCUMENTS

2014/0320144 A1* 10/2014 Nakaya ................. H01M 10/54
324/434
2017/0264110 A1* 9/2017 Toya ..................... H02J 7/0021

FOREIGN PATENT DOCUMENTS

| KR | 10-0930132 B1 | 12/2009 |
| KR | 10-1470348 B1 | 12/2014 |

\* cited by examiner

SOLAR CELL MONITORING DEVICE

CROSS REFERENCE TO PRIOR APPLICATIONS

This application is a National Stage Application of PCT International Patent Application No. PCT/KR2016/006920 filed on Jun. 29, 2016, under 35 U.S.C. § 371, which claims priority to Korean Patent Application No. 2015-0092625 filed on Jun. 30, 2015, which are all hereby incorporated by reference in their entirety.

BACKGROUND OF THE INVENTION

Field of the Invention

The present invention relates to a solar cell monitoring device.

Description of the Related Art

A solar cell converts solar energy into electrical energy. A photovoltaic power plant (also called a photovoltaic power generation system) is an assembly of solar cells in which multiple solar cell modules are connected in series or parallel.

FIG. 1 is a system diagram illustrating an example of a general photovoltaic power generation system. FIG. 2 is a circuit diagram illustrating a connection board that constitutes the general photovoltaic power generation system.

As illustrated in FIGS. 1 and 2, the general photovoltaic power generation system includes a solar cell array unit 100 which includes multiple solar cell strings 110, connection boards 200 which combines direct current power outputted from the solar cell strings 110 of the solar cell array unit 100, and an inverter 300 which converts direct current power supplied from the connection boards 200 into alternating current power.

Each of the solar cell strings 110 of the solar cell array unit 100 includes multiple solar cell modules 111 which are connected in series, and the solar cell module 111 has solar cells which are minimum units and connected in series. In the solar cell string 110, the solar cell modules 111 are connected in series to be suitable for an input voltage of the inverter 300.

The connection boards 200 are connected to the multiple solar cell strings 110, combine direct current power outputted from the solar cell strings 110, and output the direct current power to the inverter 300. The number of connection boards 200 is more than one, and each of the multiple connection boards 200 is connected to the inverter 300. The connection board 200 includes fuses 211 which are connected to output terminals of the solar cell strings 110 in series, respectively, non-return diodes 212 which are connected to the fuses 211 in series and prevent a reverse flow, and string circuits (unit series circuits) 210 which are connected to the non-return diodes 212 in series and include current transformers (not illustrated) for detecting an overcurrent and an accident current on lines. In addition, the connection board 200 includes a circuit breaker 213 connected to an output terminal connected to the string circuits 210 in parallel.

The inverter 300 is connected to the connection boards 200 and converts direct current power outputted (supplied) from the connection boards 200 into alternating current power, a voltage of the alternating current power outputted from the inverter 300 is increased to a system voltage by an electric transformer, and the alternating current power is connected to an electric power company or supplied to a load.

Meanwhile, the connection board 200 is provided with a string monitoring device 220 which may measure and monitor states of a voltage and a current of the string circuits 210. The string monitoring device 220 includes measurement instruments 221 and 222 which measure a voltage and a current of the respective string circuits 210, a display instrument 223 which displays the voltage and the current measured by the measurement instruments 221 and 222, and a communication module 224 which transmits a voltage value and a current value, which are measured by the measurement instruments 221 and 222, to the outside. In addition, the communication module 224 of the connection board 200 is connected to electric power lines 225 for supplying alternating current power at all times, communication lines 226, and ground wires 227.

A central management unit (electric room) 400 collects, calculates, and records information about measurements of the string circuits 210 transmitted from the connection boards 200, driving information of the inverter, and information about electric power monitoring equipment of a switchboard, and the central management unit 400 displays the information through a display device. With the aforementioned monitoring system, a manager monitors a power generation state of the photovoltaic power generation system through the central management unit 400.

However, the string monitoring device in the related art is configured by instruments which are operated by a relatively lower voltage and a relatively lower current than an electric power circuit, an installation environment of the connection boards 200 is poor, and it is necessary to transmit electric power over a long distance from the connection boards 200 to the central management unit 400, and as a result, there are the following problems.

First, the instrument, which constitutes the string monitoring device, is vulnerable to various types of electromagnetic disturbances such as lightning surge, switching surge, and electromagnetic waves inputted from the outside through the electric power line 225, the communication line 226, the ground wire 227, and the like, and as a result, the instrument is easily burnt out, and there is a risk of fire in the instrument.

Second, the instrument, which constitutes the string monitoring device, not only generates heat and electromagnetic noise during the operation, but also is vulnerable to electromagnetic, thermal, and mechanical environments, such that it is necessary to provide a protective device and a heat dissipation device, and as a result, there is a drawback in that manufacturing costs are increased, and an installation place of the connection board is restricted.

Third, separate wires need to be installed in order to be supplied with alternating current power at all times for operating the string monitoring device, and as a result, there is a drawback in that a wiring structure is complicated, and alternating current power is applied to the wires at all times even in the nighttime when the photovoltaic power generation is stopped.

Fourth, each of the string circuits 210 is connected to a common terminal of plus and minus electrodes in the connection board 200, and as a result, the measurement of a voltage of the string circuit 210 is not meaningful because of an equal terminal voltage, but the measurement of a current of the string circuit 210 is effective. However, the measurement of the current often varies depending on a change in weather, and as a result, reliability deteriorates, only whether the power generation is performed may be confirmed, and there is a limitation in recognizing a cause of a breakdown.

Fifth, because the photovoltaic power generation system has a high capacity, electric power of the single string circuit 210 is very low in consideration of the entire photovoltaic power generation system, and as a result, an effect of quality of the individual string circuit 210, which affects an overall power generation amount, is insignificant. Therefore, the string monitoring is often omitted, such that the number of string circuits connected to the single inverter 300 is 100 to 300 because of a high capacity of the inverter 300, and as a result, there is a limitation in determining quality of a power generation state only by using input and output values of the inverter 300.

SUMMARY OF THE INVENTION

An aspect of the present invention provides a solar cell monitoring device which improves reliability in monitoring solar cell strings and has a simple configuration.

An aspect of the present invention also provides a solar cell monitoring device which is freely installed at any place and manufactured with low manufacturing costs.

According to an aspect of the present invention, there is provided a solar cell monitoring device including: an inverter; connection boards which include multiple string circuits, respectively; a terminal block which is provided at an input side of the inverter, and includes multiple branch terminals which are connected to wires that are connected to the connection boards, respectively and supply direct current power to the inverter; detection elements which are provided at a side of the branch terminals; and a measurement unit which measures the currents of the wires which are detected by the detection elements.

The detection elements may further detect voltages, and the measurement unit may further measure the voltages detected by the detection elements.

The solar cell monitoring device may further include a main display unit which is connected to the measurement unit, and displays voltage values and current values of the wires.

The terminal block may include a base plate which is fixed to a frame, and multiple branch terminals which extend and protrude from one side of the base plate and are connected to the wires, and each of the detection elements may be formed in a quadrangular ring shape such that one branch terminal is positioned by penetrating one detection element.

Meanwhile, the terminal block may include a base plate which is fixed to a frame and has therein multiple branch terminals connected to the wires, and each of the detection elements may be formed in a circular ring shape such that one wire is positioned by penetrating one detection element so that the detection element is adjacent to the branch terminal.

The detection elements may be mounted on a support member.

Meanwhile, the terminal block may include a base plate which is fixed to a frame and has therein multiple branch terminals connected to the wires, each of the detection elements may include a body which has a round bar shape, and terminal units which are provided at both sides of the body, respectively, the detection elements may be mounted on a support member, the wires may be connected to the terminal units at one side of the detection elements, and auxiliary wires may be connected to the terminal units at the other side of the detection elements and the branch terminals of the base plate.

The connection board may be provided with an inspection unit, and the inspection unit may include current detection elements which are connected to the string circuits of the connection boards and detect currents, switches which are provided in the string circuits, respectively, and an auxiliary display unit which is connected to the current detection elements and displays current values of the string circuits.

According to the present invention, the direct current power of the connection boards, which is inputted to the input side of the inverter, is measured and monitored for each connection board, such that the direct current power outputted from the connection boards may be actually monitored. Further, when one of the connection boards is broken down, the broken connection board may be accurately and quickly recognized and inspected, and as a result, it is possible to improve monitoring reliability and quickly solve a breakdown when the breakdown occurs.

In addition, according to the present invention, the configuration in the related art for monitoring the string circuits of the connection boards is omitted, and the communication module and the communication line for monitoring the string circuits and transmitting the monitoring result to the central management unit are not used, thereby minimizing a risk of a breakdown and fire of the connection board. Further, the electric power line and the communication line for supplying electric power at all times for communication between the central management unit and the connection board are omitted, such that a route of various types of electromagnetic disturbances such as electromagnetic waves inputted from the outside through the electric power line and the communication line is eliminated, and as a result, the inverter and other instruments are prevented from being affected by the electromagnetic disturbances.

In addition, according to the present invention, the configuration in the related art for monitoring the string circuits of the connection boards is omitted, such that the configuration is simplified, and as a result, costs required to install the photovoltaic power generation system are reduced, and maintenance of the photovoltaic power generation system is conveniently performed.

In addition, it is not necessary to perform communication with the central management unit in the case in which the inspection unit is installed in the connection board, such that an instrument, which has high resistance against electromagnetic, thermal, and mechanical environments, may be selected and applied, and there is less restriction to manufacturing specifications and installation environments of the connection boards, and as a result, the photovoltaic power generation system may be installed in various environments.

DETAILED DESCRIPTION OF THE PREFERRED EMBODIMENT

Hereinafter, an exemplary embodiment of a solar cell monitoring device according to the present invention will be described with reference to the accompanying drawings.

Figure 1:
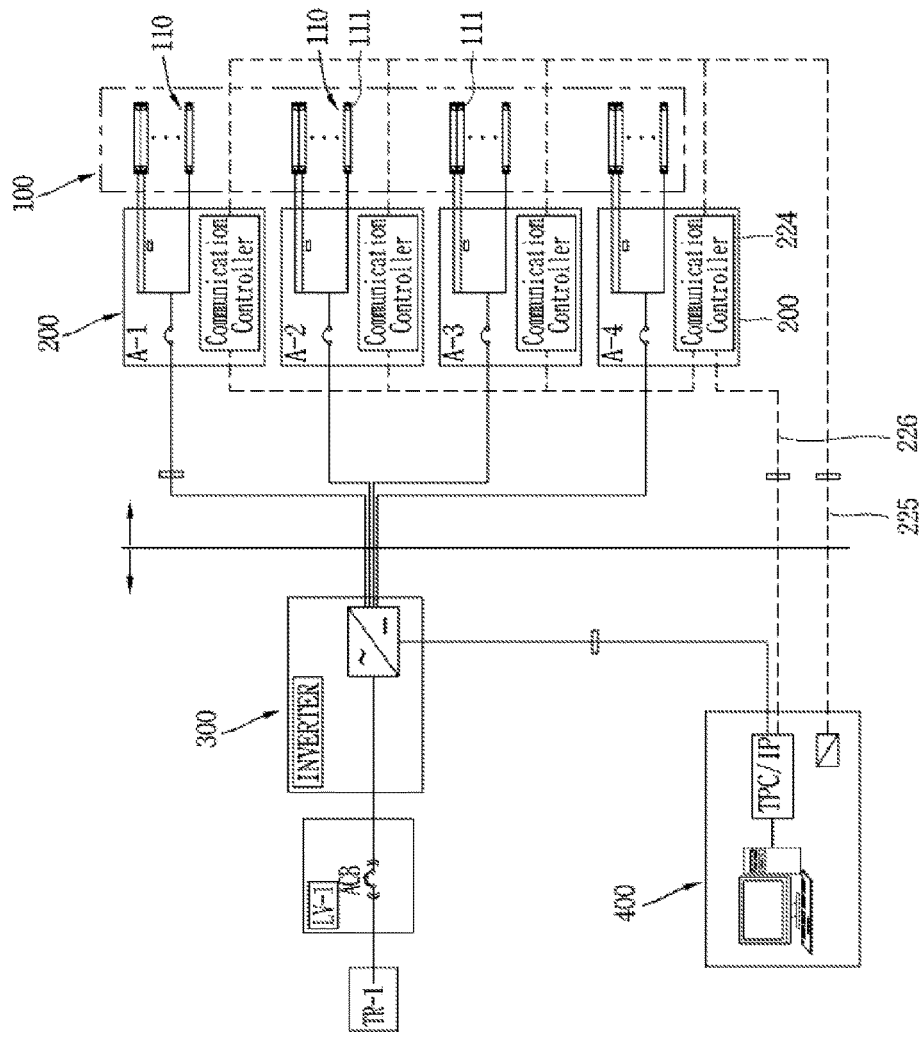
FIG. 1 is a system diagram illustrating an example of a general photovoltaic power generation system.
Figure 2:
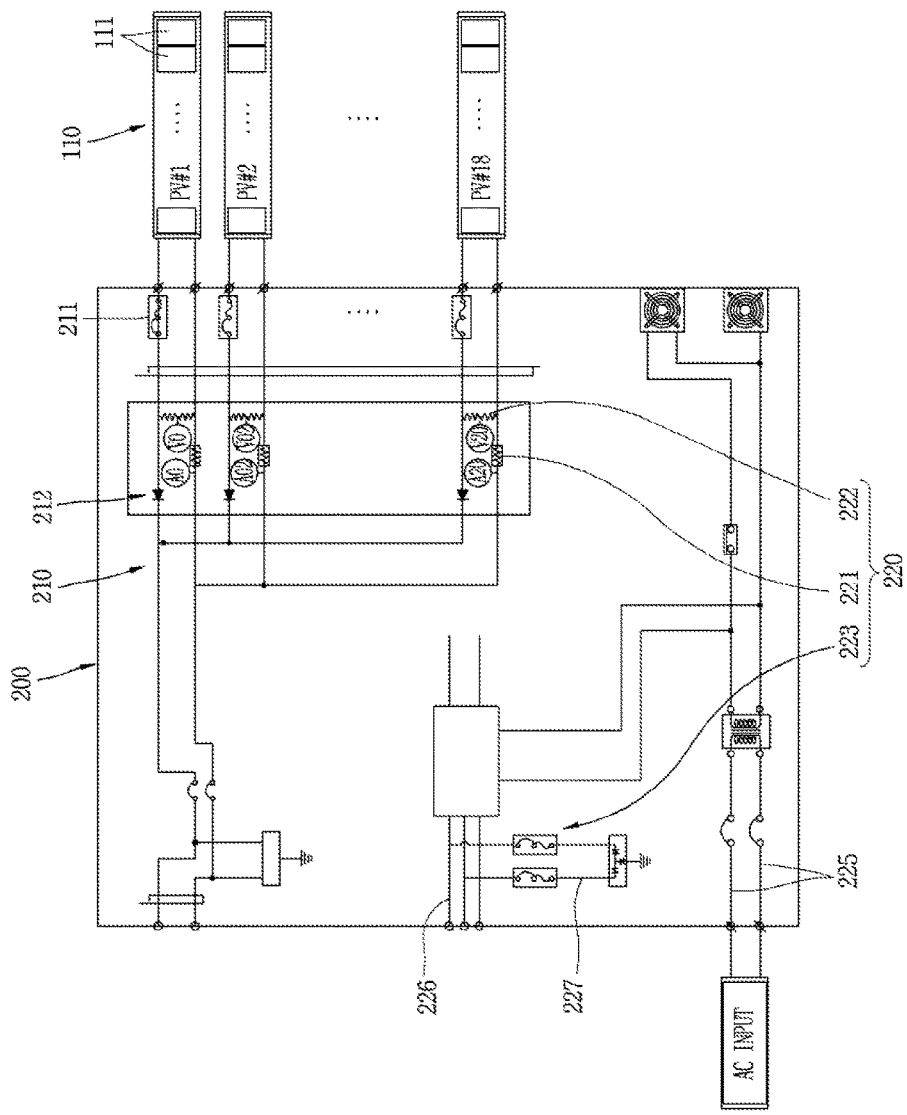
FIG. 2 is a circuit diagram illustrating a connection board that constitutes the general photovoltaic power generation system.
Figure 3:
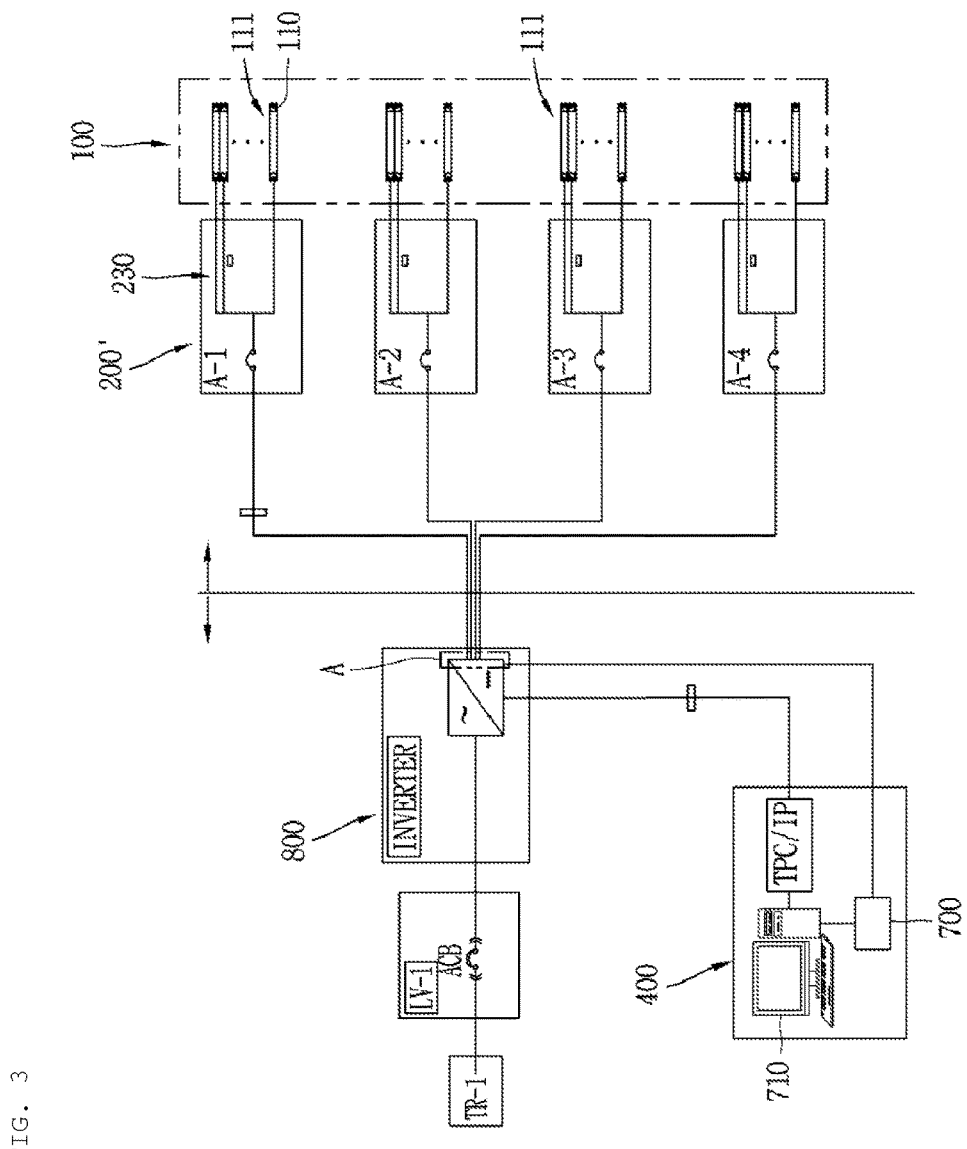
FIG. 3 is a system diagram of a photovoltaic power generation system provided with a solar cell monitoring device according to an exemplary embodiment of the present invention.
Figure 4:
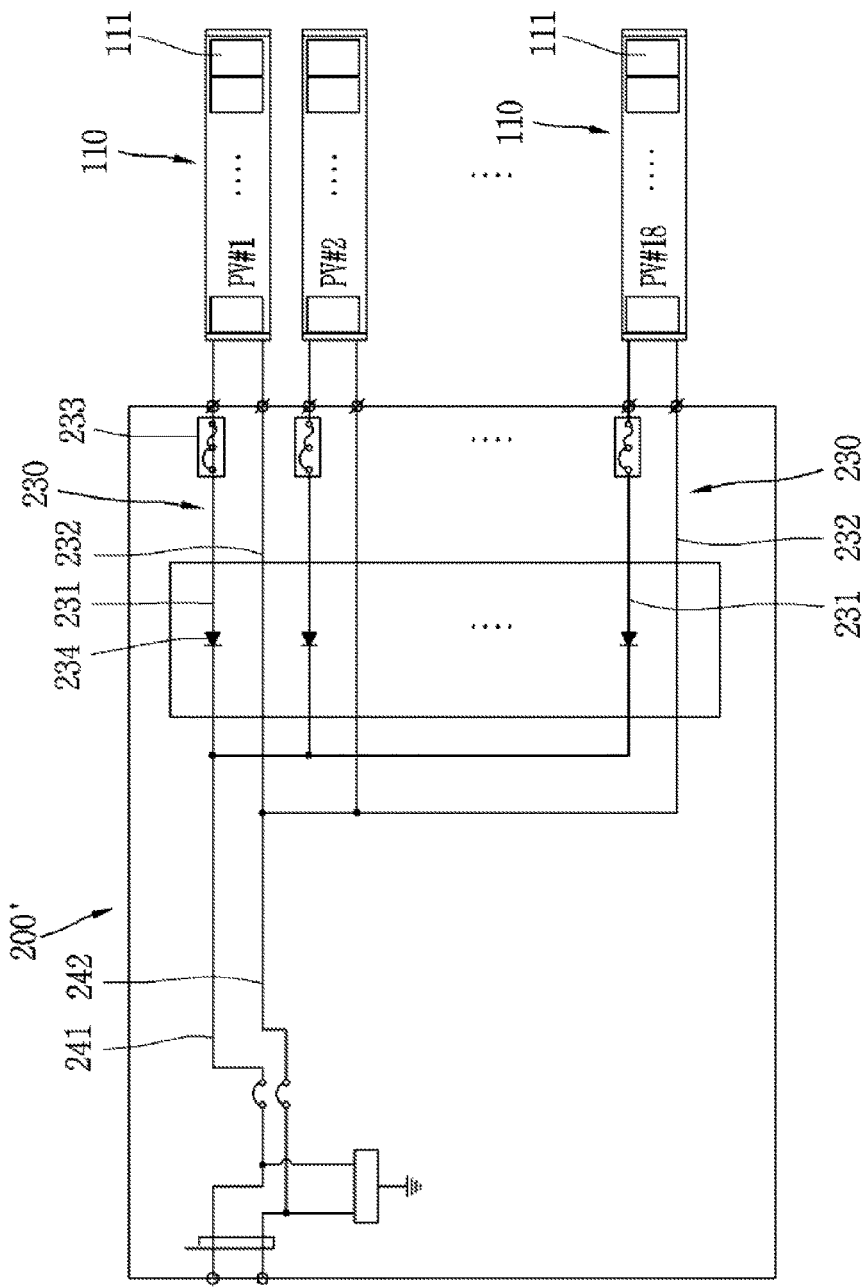
FIG. 4 is a circuit diagram illustrating the solar cell monitoring device provided with a connection board and a solar cell array unit according to the exemplary embodiment of the present invention.
Figure 5:
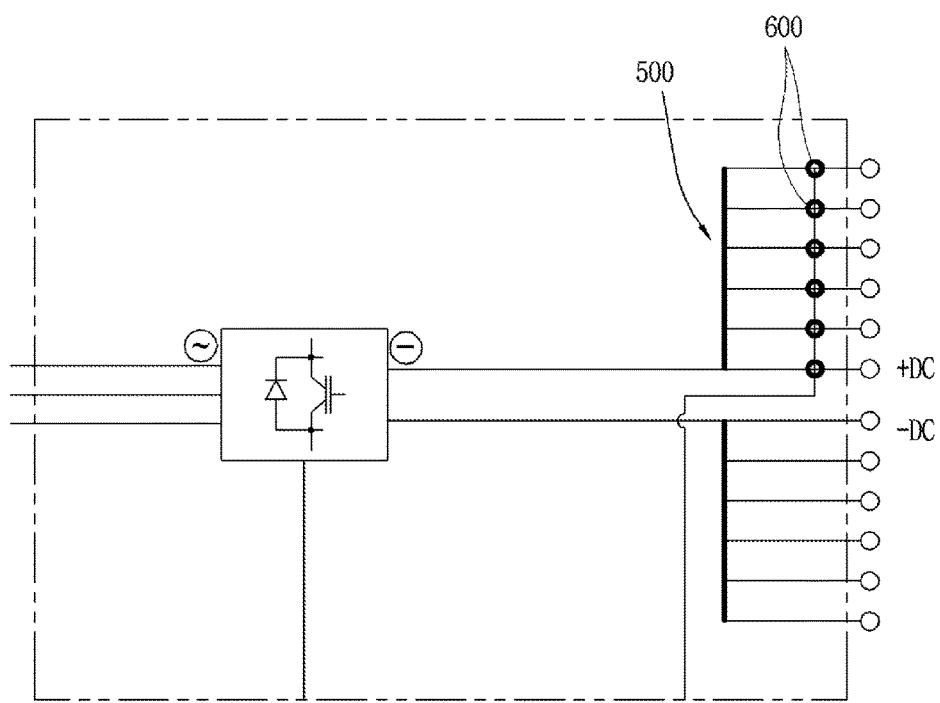
FIG. 5 is a circuit diagram illustrating the solar cell monitoring device according to the exemplary embodiment of the present invention.

FIG. 3 is a system diagram of a photovoltaic power generation system provided with a solar cell monitoring device according to an exemplary embodiment of the present invention. FIG. 4 is a circuit diagram illustrating the solar cell monitoring device provided with a connection board and a solar cell array unit according to the exemplary embodiment of the present invention. FIG. 5 is a circuit diagram illustrating the solar cell monitoring device according to the exemplary embodiment of the present invention.

First, as illustrated in FIG. 3, a photovoltaic power generation system provided with a solar cell monitoring device according to an exemplary embodiment of the present invention includes a solar cell array unit 100, connection boards 200', a terminal block 500, detection elements 600, a measurement unit 700, and an inverter 800.

The solar cell array unit 100 includes multiple solar cell strings 110. Each of the solar cell strings 110 includes multiple solar cell modules 111 which are connected in series, and the solar cell module 111 has solar cells which are minimum units and connected in series. In the solar cell string 110, the solar cell modules 111 are connected in series to be suitable for an input voltage of the inverter.

The connection boards 200' include string circuits 230 which combine direct current power outputted from the multiple solar cell strings 110. Each of the string circuits 230 of the connection boards 200' includes a plus side circuit line 231 which connects, in series (or parallel), plus terminals of the solar cell modules 111 that constitute the solar cell strings 110, and a minus side circuit line 232 which connects, in series (or parallel), minus terminals of the solar cell modules 111. In addition, the string circuit 230 includes a fuse 233 which is connected to an output terminal of the solar cell string 110 in series, a non-return diode 234 which is connected to the fuse 233 in series and prevents a reverse flow, and a current transformer (not illustrated) which is connected to the non-return diode 234 in series and detects an overcurrent and an accident current on lines. Further, the plus side circuit lines 231 of the string circuits 230 of each of the connection boards 200' are connected to a single plus side wire (cable) 241, and the minus side circuit lines 232 of the string circuits 230 of each of the connection boards 200' are connected to a single minus side wire (cable) 242.

The inverter 800 is connected to the connection boards 200' and converts direct current power outputted (supplied) from the connection boards 200' into alternating current power. A voltage of the alternating current power outputted from the inverter 800 is increased to a system voltage by the electric transformer, and the alternating current power is provided to an electric power company or supplied to a load.

The terminal block 500 is provided at an input side of the inverter 800. The input side terminal block 500 includes multiple branch terminals which are connected to wires, respectively, that are provided in the connection boards 200', respectively, and supply the direct current power to the inverter 800. The plus side wires of the connection boards are connected to the branch terminals of the input side terminal block, respectively.

The detection elements 600 are provided at the branch terminals 510 of the input side terminal block 500, respectively.

The measurement unit 700 may measure currents and voltages of the wires 241 which are detected by the detection elements 600.

Figure 6:
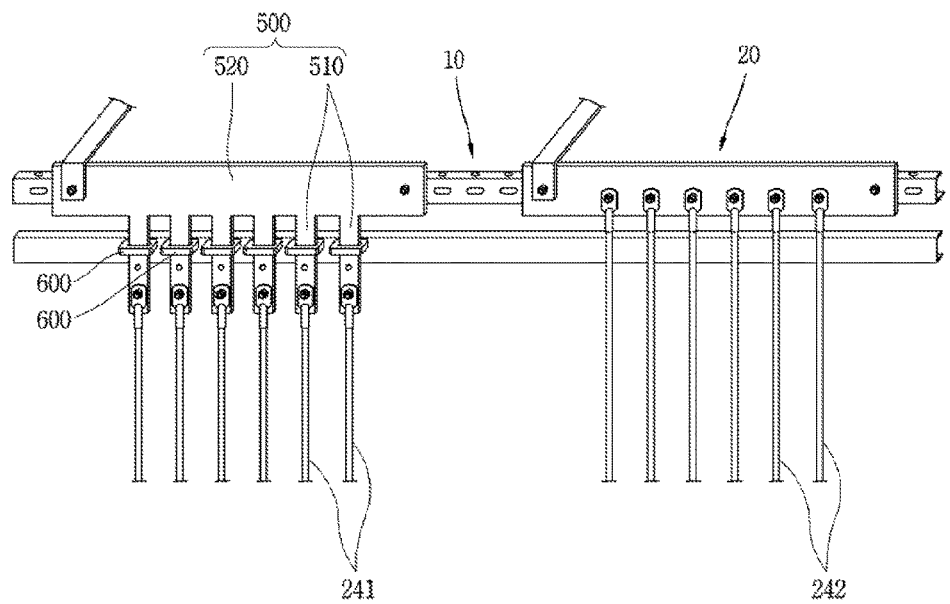
FIG. 6 is a front view illustrating a first exemplary embodiment of an input side terminal block of an inverter that constitutes the solar cell monitoring device according to the exemplary embodiment of the present invention.

As illustrated in FIG. 6, as a first exemplary embodiment of the input side terminal block 500 of the inverter 800, the input side terminal block 500 includes a base plate 520 which is fixed to a frame 10, and multiple branch terminals 510 which extends and protrudes from one side of the base plate 520. The plus side wires 241 of the connection boards 200' are connected to the branch terminals 510 of the input side terminal block 500.

Each of the detection elements 600 is formed in a quadrangular ring shape, and one branch terminal 510 of the input side terminal block 500 is positioned by penetrating one detection element 600. The detection elements 600 may be mounted on a support member 30 positioned adjacent to the input side terminal block 500. The detection elements 600 may be arranged in a row on the support member 30, and the detection elements 600 are connected to the measurement unit 700.

A minus terminal block 20 is mounted on the frame 10, and the minus side wires 242 of the connection boards 200' are connected to the minus terminal block 20.

Figure 7:
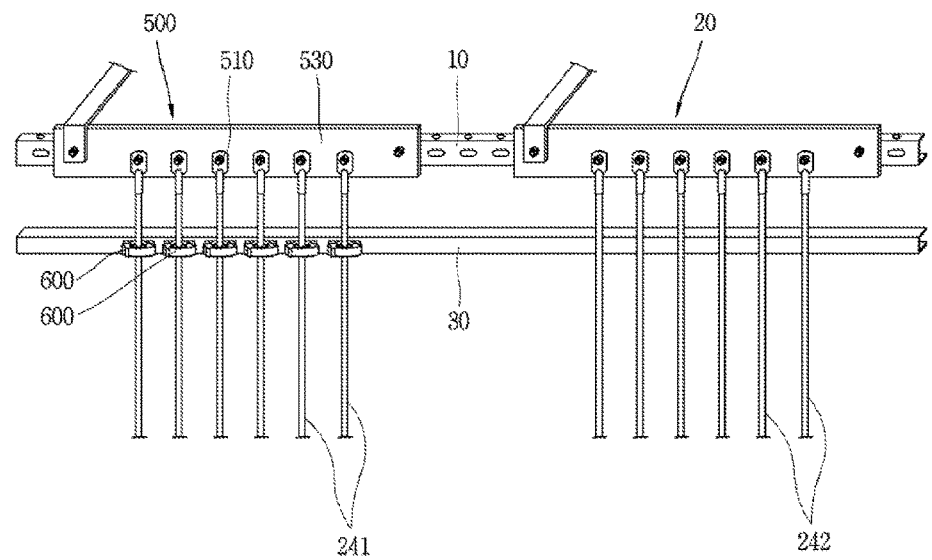
FIG. 7 is a front view illustrating a second exemplary embodiment of the input side terminal block of the inverter that constitutes the solar cell monitoring device according to the exemplary embodiment of the present invention.

As illustrated in FIG. 7, as a second exemplary embodiment of the input side terminal block 500 of the inverter 800, the input side terminal block 500 includes a base plate 530 which is fixed to the frame 10 and provided with multiple branch terminals 510 therein. The plus side wires 241 of the connection boards 200' are connected to the branch terminals 510 of the input side terminal block 500.

Each of the detection elements 600 is formed in a circular ring shape, and one wire 241 is positioned by penetrating one detection element 600 so that the detection element 600 is adjacent to the branch terminal 600. The detection elements 600 may be mounted on the support member 30 positioned adjacent to the input side terminal block 500. The detection elements 600 may be arranged in a row on the support member 30, and the detection elements 600 are connected to the measurement unit 700.

Figure 8:
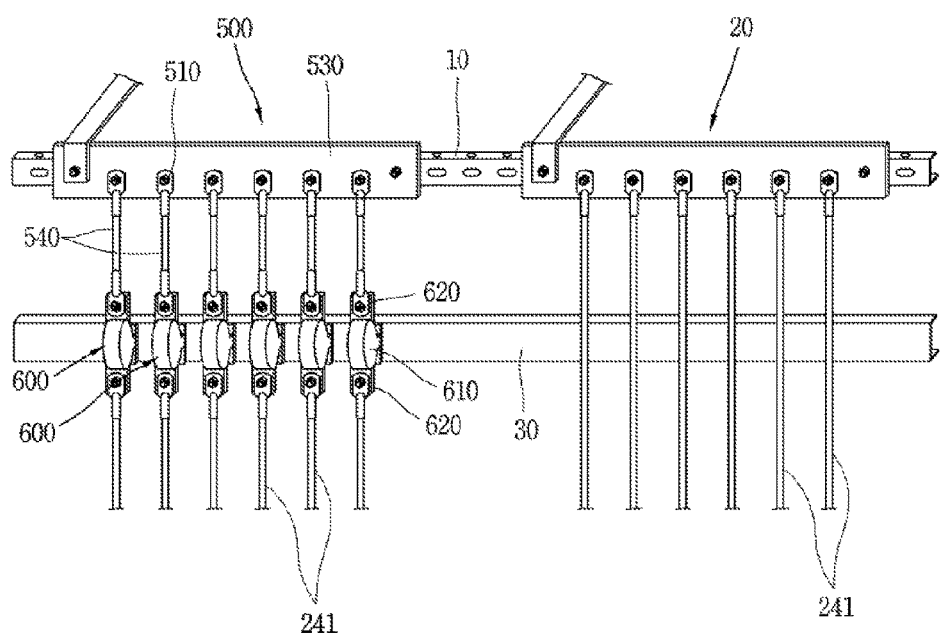
FIG. 8 is a front view illustrating a third exemplary embodiment of the input side terminal block of the inverter that constitutes the solar cell monitoring device according to the exemplary embodiment of the present invention.

As illustrated in FIG. 8, as a third exemplary embodiment of the input side terminal block 500 of the inverter 800, the input side terminal block 500 includes a base plate 530 which is fixed to the frame 10 and provided therein with multiple branch terminals 510 to which the wires are connected. Each of the detection elements 600 includes a body 610 which has a round bar shape, and terminal units 620 which are provided at both sides of the body 610, respectively. The body 610 of the detection element 600 includes an annular ring which is connected to the terminal units 620 and has a ring shape, and a molding member which surrounds the annular ring. The support member 30 is positioned adjacent to the input side terminal block 500, and the detection elements 600 may be arranged in a row on the support member 30. Auxiliary wires 540 are connected to the terminal units 620 at one side of the detection elements 600 and the branch terminals 510 of the input side terminal block 500, and the plus side wires 241 of the connection boards 200' are connected to the terminal units 620 at the other side of the detection elements 600. The detection elements 600 are connected to the measurement unit 700.

In the first to third exemplary embodiments of the input side terminal block 500 of the inverter 800, when the direct current power, which is outputted through the plus side wires 241 of the connection boards 200', is inputted to the inverter 800 through the branch terminals 510 of the input side terminal block 500, the detection elements 600, which are positioned adjacent to the branch terminals 510, detect the currents or both of the current and the voltage, and the currents detected by the detection elements 600 are measured by the measurement unit 700.

The measurement unit 700 may be the measurement unit 700 connected to the inverter 800.

A main display unit 710 may be connected to the measurement unit 700. The main display unit 710 displays current values of the wires 241 which are detected by the measurement unit 700. When the measurement unit 700 measures a current value and a voltage value, the current value and the voltage value are displayed on the main display unit 710.

The measurement unit 700 and the main display unit 710 are installed in a central management unit (electric room).

Figure 9:
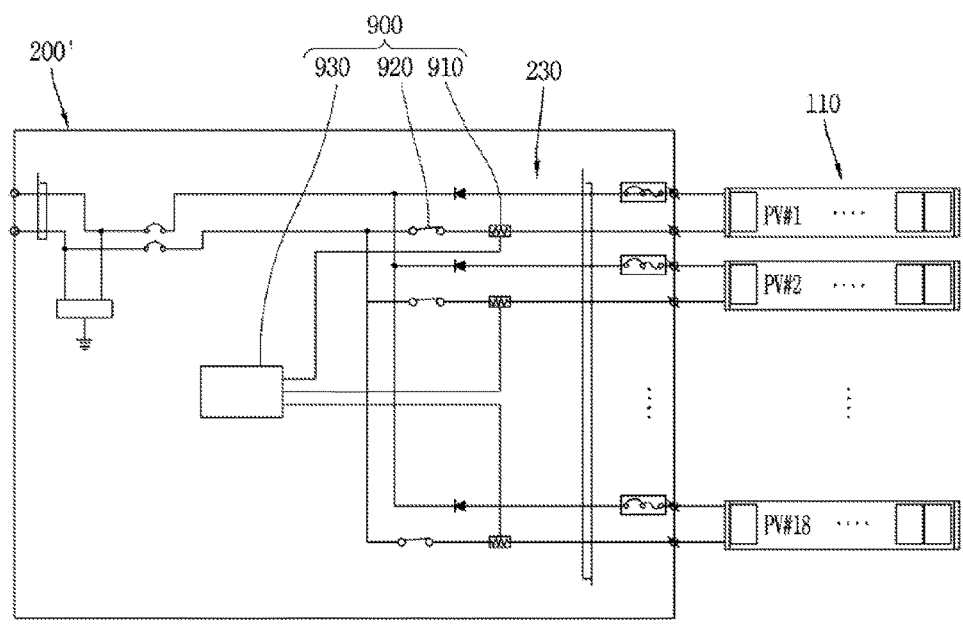
FIG. 9 is a circuit diagram illustrating an inspection unit that constitutes the solar cell monitoring device according to the exemplary embodiment of the present invention.

The connection board 200' may be provided with an inspection unit 900. The inspection unit 900 not only enables a manager to easily inspect the string circuits 230 that constitute the connection boards 200', but also enables the manager to easily find an abnormal string circuit 230 among the string circuits 230. As illustrated in FIG. 9, as an example of the inspection unit 900, the inspection unit 900 includes current detection elements 910 which are connected to the string circuits 230 of the connection boards 200', respectively, and detect currents, an auxiliary display unit 920 which is connected to the current detection elements 910 and displays current values of the string circuits 230, and switches 930 which are provided in the string circuits 230, respectively.

Hereinafter, an operation and an effect of the solar cell monitoring device according to the present invention will be described.

Direct current power is generated in the solar cell modules 111 by solar energy. The direct current power generated in the solar cell modules 111 is outputted from each of the solar cell strings connected to the string circuits 230 of the connection boards 200', and the direct current power outputted from each of the solar cell strings is combined by the string circuits 230 of the connection boards 200' and outputted to the wires of each of the connection boards 200'. The direct current power outputted through the plus side wires 241 of the connection boards 200' is inputted to the inverter 800 through the branch terminals 510 of the input side terminal block 500 at the input side of the inverter 800.

The detection elements 600, which are provided at the side of the branch terminals 510 of the input side terminal block 500 of the inverter 800, detect the direct current power inputted to the branch terminals 510 of the input side terminal block 500 through the wires 241 of the connection boards 200', and the measurement unit 700 measures the current (or both of the current and the voltage) detected by the detection elements 600, thereby measuring current values inputted to the branch terminals 510 of the input side terminal block 500 of the inverter 800. If the main display unit 710 is connected to the measurement unit 700, the current value or both of the current value and the voltage value, which are inputted to the branch terminals 510 of the input side terminal block 500, are displayed on the main display unit 710.

In the central management unit 400, the manager determines whether a preset amount of direct current power is inputted through the branch terminals 510 of the input side terminal block 500 of the inverter 800 while performing monitoring through the measurement unit 700 or both of the measurement unit 700 and the main display unit 710, thereby inspecting each of the connection boards 200'. Assuming that the number of branch terminals 510 of the input side terminal block 500 of the inverter 800 is 10 and a current value or both of a current value and a voltage value detected at a fifth branch terminal are below a preset value, it can be seen that the connection board 200' connected to the fifth branch terminal is broken down. Therefore, the manager may solve the breakdown by inspecting the solar cell strings 110 connected to the string circuits 230 of the broken connection board 200'. Meanwhile, the inspection unit 900 may be used to inspect the broken connection board 200'. That is, it is possible to solve the breakdown by finding a broken solar cell string 230, among the solar cell strings 230 connected to the string circuits 230 of the connection board 200' by checking the auxiliary display unit 920 of the inspection unit 900.

As described above, in the present invention, the direct current power of the connection boards 200', which is inputted to the input side of the inverter 800, is measured and monitored for each connection board 200', such that the direct current power outputted from the connection boards 200' may be actually monitored. Further, when one of the connection boards 200' is broken down, the broken connection board 200' may be accurately and quickly recognized and inspected, and as a result, it is possible to improve monitoring reliability and quickly solve a breakdown when the breakdown occurs.

In addition, according to the present invention, the configuration in the related art for monitoring the string circuits 230 of the connection boards 200' is omitted, and the communication module 224 and the communication line 226 for monitoring the string circuits 230 and transmitting the monitoring result to the central management unit 400 are not used, thereby minimizing a risk of a breakdown and fire of the connection board 200'. Further, the electric power line 225 and the communication line 226 for supplying electric power at all times for communication between the central management unit 400 and the connection board 200' are omitted, such that a route of various types of electromagnetic disturbances such as electromagnetic waves inputted from the outside through the electric power line 225 and the communication line 226 is eliminated, and as a result, the inverter 800 and other instruments are prevented from being affected by the electromagnetic disturbances.

In addition, according to the present invention, the configuration in the related art for monitoring the string circuits 230 of the connection boards 200' is omitted, such that the configuration is simplified, and as a result, costs required to install the photovoltaic power generation system are reduced, and maintenance of the photovoltaic power generation system is conveniently performed.

In addition, it is not necessary to perform communication with the central management unit 400 in the case in which the inspection unit 900 is installed in the connection board 200', such that an instrument, which has high resistance against electromagnetic, thermal, and mechanical environments, may be selected and applied, and there is less restriction to manufacturing specifications and installation environments of the connection boards 200', and as a result, the photovoltaic power generation system may be installed in various environments.

What is claimed is:

1. A solar cell monitoring device comprising:
   an inverter;
   connection boards which include multiple string circuits, respectively;
   a terminal block which is provided at an input side of the inverter, and has multiple branch terminals which are connected to wires that are connected to the connection boards, respectively and supply direct current power to the inverter;
   detection elements which detect currents flowing along the wires connected to the branch terminals; and
   a measurement unit which measures the currents of the wires which are detected by the detection elements,
   wherein each of the detection elements is formed in a quadrangular ring shape, such that one branch terminal is positioned by penetrating one detection element.

2. The solar cell monitoring device of claim 1, wherein the detection elements further detect voltages, and the measurement unit further measures the voltages detected by the detection elements.

3. The solar cell monitoring device of claim 1, further comprising:
   a main display unit which is connected to the measurement unit, and displays voltage values and current values of the wires.

4. A solar cell monitoring device comprising:
   an inverter;
   connection boards which include multiple string circuits, respectively;
   a terminal block which is provided at an input side of the inverter, and has multiple branch terminals which are connected to wires that are connected to the connection boards, respectively and supply direct current power to the inverter;
   detection elements which detect currents flowing along the wires connected to the branch terminals; and
   a measurement unit which measures the currents of the wires which are detected by the detection elements,
   wherein each of the detection elements is formed in a circular ring shape, such that one wire is positioned by penetrating one detection element.

5. The solar cell monitoring device of claim 4, wherein the detection elements further detect voltages, and the measurement unit further measures the voltages detected by the detection elements.

6. The solar cell monitoring device of claim 4, further comprising:
   a main display unit which is connected to the measurement unit, and displays voltage values and current values of the wires.

7. A solar cell monitoring device comprising:
   an inverter;
   connection boards which include multiple string circuits, respectively;
   a terminal block which is provided at an input side of the inverter, and has multiple branch terminals which are connected to wires that are connected to the connection boards, respectively and supply direct current power to the inverter;
   detection elements which detect currents flowing along the wires connected to the branch terminals; and
   a measurement unit which measures the currents of the wires which are detected by the detection elements,
   wherein each of the detection elements includes a body which has a round bar shape, and terminal units which are provided at both sides of the body, respectively, the wires connected to the connection boards are connected to the terminal units at one side of the detection elements, and the terminal units at the other side of the detection elements are connected to the branch terminals of the terminal block.

8. The solar cell monitoring device of claim 7, wherein the detection elements further detect voltages, and the measurement unit further measures the voltages detected by the detection elements.

9. The solar cell monitoring device of claim 7, further comprising:
   a main display unit which is connected to the measurement unit, and displays voltage values and current values of the wires.

* * * * *